United States Patent [19]

Sugano et al.

[11] Patent Number: 5,220,491
[45] Date of Patent: Jun. 15, 1993

[54] HIGH PACKING DENSITY MODULE BOARD AND ELECTRONIC DEVICE HAVING SUCH MODULE BOARD

[75] Inventors: Toshio Sugano, Kodaira; Seiichiro Tsukui, Kawagoe, both of Japan

[73] Assignees: Hitachi, Ltd., Tokyo; ; Hitachi Tobu Semiconductor Ltd., Saitama, both of Japan

[21] Appl. No.: 681,270

[22] Filed: Apr. 8, 1991

[30] Foreign Application Priority Data

Apr. 9, 1990 [JP] Japan .................................. 2-093466

[51] Int. Cl.⁵ .............................................. H05K 1/11
[52] U.S. Cl. ................................... 361/412; 361/392; 361/393; 361/395; 361/413; 439/62; 439/65
[58] Field of Search ............... 174/251, 253, 255, 261; 361/392, 393, 395, 396, 403–406, 409, 412, 413, 414, 417, 419, 420; 439/62, 65

[56] References Cited

U.S. PATENT DOCUMENTS

| | | | |
|---|---|---|---|
| 3,395,318 | 7/1968 | Laermer et al. | 361/404 |
| 4,689,719 | 8/1987 | Prussas et al. | 361/405 |
| 4,701,830 | 10/1987 | Kato et al. | 361/404 |
| 4,730,238 | 3/1988 | Cook | 361/414 |
| 4,763,188 | 8/1988 | Johnson | 357/74 |
| 4,801,916 | 1/1989 | Kaindl et al. | 361/406 |
| 4,949,223 | 8/1990 | Achiwa | 361/405 |

FOREIGN PATENT DOCUMENTS

| | | | |
|---|---|---|---|
| 1259427 | 4/1975 | Fed. Rep. of Germany | 361/406 |
| 2719047 | 11/1978 | Fed. Rep. of Germany | 361/405 |
| 0035817 | 10/1971 | Japan | 361/404 |
| 63-75051 | 5/1988 | Japan | |
| 0220498 | 9/1989 | Japan | 361/424 |

Primary Examiner—Leo P. Picard
Assistant Examiner—D. Sparks
Attorney, Agent, or Firm—Pennie & Edmonds

[57] ABSTRACT

A module board has a supporting plate and slender lead pins having their first portions arranged substantially in parallel with one another on a plane substantially coplanar with the supporting plate. The supporting plate and the first portions of the slender lead pins are sandwiched between electrically insulating layer members. The supporting plate and the first portions of the lead pins are isolated from one another with an electrically insulating material between the pair of electrically insulating layer members. Second portions of the lead pins protrude from the pair of electrically insulating layer members. Through holes are provided one for each of the lead pins and through hole conductors are formed on the inner walls of the through holes. Each of the through hole conductors passes through the pair of electrically insulating layer members and the first portion of its associated one of the lead pins and is in electrical connection with a pattern of electrical conductors provided on the pair of electrically insulating layer members, thereby fixing its associated lead pin to the board and electrically connecting its associated lead pin to the pattern of electrical conductors.

12 Claims, 10 Drawing Sheets

HIGH PACKING DENSITY MODULE BOARD AND ELECTRONIC DEVICE HAVING SUCH MODULE BOARD

BACKGROUND OF THE INVENTION

This invention relates to a module board and an electronic device having a plurality of semiconductor devices mounted on the module board.

The memory board of a computer has a mother board including connection patterns and so on and a plurality of memory modules mounted thereon in order to construct one memory system. This memory board tends to increase its capacity, and hence, the number of semiconductor memory devices to be mounted per unit area of the module board of each memory module (namely, the packing density tends to be increased). On the memory board are mounted a plurality of electronic devices (memory modules), each of which, as shown in FIG. 1A (plan view) and FIG. 2 (side view), has a plurality of semiconductor memory devices 2 mounted on the main surface including wiring patterns (hereinafter, referred to as the mounting surface) of a board (module board) 1, and lead pins 3 provided along one edge of this module board 1 to electrically connect to the semiconductor devices 2. These electronic modules, or devices are mounted on the mounting surface of the memory board 100 so that the module boards 1 are vertically erected on the mounting surface as shown in FIG. 1B. Thus, the way to mount these electronic modules on the mounting surface of the memory board 100 can increase the packing density since the area which the modules occupy on the mounting surface is small.

The module board 1 is made of, for example, an epoxy-based resin printed-module board having wiring conductor pattern provided on the surface or within it. This printed wiring pattern is formed of a single-layer or multilayer, and electrically connects the semiconductor memory devices 2 and the lead pins 3.

The semiconductor memory device 2 is, for example, a DRAM (Dynamic Random Access Memory). This semiconductor memory device 2 has a semiconductor chip with a DRAM function packaged by plastic molding. The plastic mold package is, for example, in a SOJ type or DIP type structure.

The lead pins 3 each have first end formed in a clamp shape as shown in FIGS. 2 and 3 (perspective views). The first end of each lead pin 3 holds between its tongues a margin 1A at one edge of the module board 1 and is bonded and fixed thereto with solder 4. Thus, the first ends (clamp portions) of the leads 3 are electrically connected to the wiring conductors of the module board 1 by the bonding using the solder 4. The other (second) ends of the lead pins 3 are inserted into the mounting surface of the memory board (mother board). In other words, the electronic modules are mechanically and electrically connected to the wiring conductors of the module board 1 through the lead pins 3 and mounted on the mounting surface of the memory board (mother board) since the connection of the first ends of the lead pins 3 to the margins is mechanically strengthened with their clamping force (elastic force).

Lead pin insertion type electronic modules are described, for example, in the Hitachi IC MEMORY DATA BOOK, Mar. 1989., pp. 697–708.

In this electronic module, however, the module board 1 has the margin 1A which first ends of the lead pins 3 hold between their tongues as described above. This margin 1A assures a mechanical strength and makes electrical connection, but occupies a large area on the mounting surface of the module board 1. Thus, since the area of the module board 1 is increased by the amount corresponding to the area occupied by the margin, the packing density of the electronic module is reduced.

Moreover, in the memory board on which the electronic modules are mounted, the height of the vertically mounted modules relative to the mounting surface is increased by the amount corresponding to the area of the margin 1A provided on the module board 1, and thus the packing density in the height direction is reduced.

In addition, the lead pins 3 of the module are bonded to the margin with the solder 4 which has a low melting point, and a great number of semiconductor memory devices 2 are mounted at a high density on the module board. Therefore, the solder 4 may be melted by heat generated by the semiconductor memory devices 2. In this case, the module board 1 of the electronic module would be supported by only the clamping force of the lead pins 3. Thus, the resulting poor bonding between the lead pins 3 and the module board 1 will reduce the electrical reliability of the module.

Also, each of the lead pins 3 of the module, as shown in FIG. 3, has three clamping tongues provided on its first end, one of which holds the mounting surface of the module board and the other two of which hold the opposite surface thereof, thereby clamping the margin of the module board. Therefore, the arrangement pitch of the lead pins 3 along the margin is determined by the two clamping tongues at one end of each lead pin, so that the area occupied by the margin 1A is increased in the arrangement direction of the lead pins 3 along the edge of the module board 1, thus lowering the packing density of the module.

In this connection, JP-U-63-75051 (Japanese Utility Model Application Laid-open No. 63-75051, laid open on May 19, 1988) discloses a semiconductor module mounted on a printed circuit board with its lead pins similar to those shown in FIG. 3 inserted into through holes.

SUMMARY OF THE INVENTION

Accordingly, it is an object of the invention to provide a technique for mounting electronic devices on a mother board at a high density.

It is another object of the invention to provide a module board for electronic devices.

It is still another object of the invention to increase electrical reliability of an electronic device.

According to one aspect of the present invention, a module board has a supporting plate and slender lead pins having their first portions arranged substantially in parallel with one another on a plane substantially coplanar with the supporting plate. The supporting plate and the first portions of the slender lead pins are sandwiched between electrically insulating layer members. The supporting plate and the first portions of the lead pins are isolated from one another with an electrically insulating material between the pair of electrically insulating layer members. Second portions of the lead pins protrude from the pair of electrically insulating layer members. Through holes are provided one for each of the lead pins and through hole conductors are formed on the inner walls of the through holes. Each of the through hole conductors passes through the pair of electrically insulating layer members and the first portion of its associated one of the lead pins and is in electrical connection with a pattern of electrical conductors provided on the pair of electrically insulating layer members, thereby fixing its associated lead pin to the board and electrically connecting its associated lead pin to the pattern of electrical conductors.

The above-mentioned module board can enjoy one or more of the following effects.

There is no need to provide the margin which is held between the tongues of each lead pin for assuring the mechanical strength and electrical connection on the mounting surface along one edge of the board, and thus the size of the board can be reduced by an amount corresponding to the area of this margin, resulting in an increase of the packing density of the module.

In a mother board on which electronic devices or modules are mounted, the height of the vertically mounted modules relative to the mounting surface of the mother board can be reduced by an amount corresponding to the increase of the packing density of the module, so that the packing density in the height direction can be increased.

A pattern of conductors formed on the board and the lead pins are bonded and fixed to each other by means of through-hole plated layers which have a high melting point, and the connections therebetween are not melted by heat generated by operating semiconductor devices. Thus, the mechanical strength between the board and the lead pins can be assured and poor connections can be prevented so that the electrical reliability of the module can be increased.

DESCRIPTION OF THE PREFERRED EMBODIMENTS

Figure 1A:
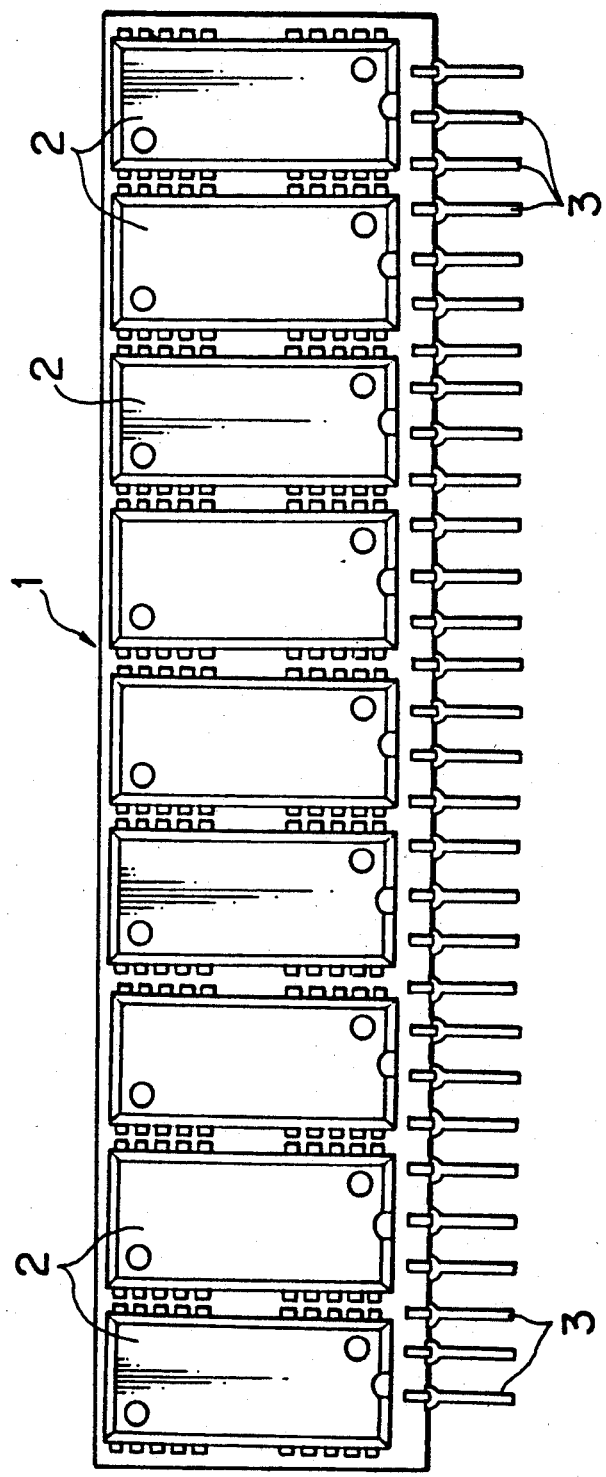
FIG. 1A is a plan view of a conventional electronic device.

A module board according to one embodiment of this invention will be described with reference to FIGS. 4 and 5.

A module board 10 has a supporting plate or frame 12A, a plurality of slender lead pins 12B, and a pair of electrically insulating layer members which hold or sandwich therebetween the supporting plate or frame 12A and parts (first portions) of the lead pins 12B. Each of the insulating layer members includes, according to this embodiment, an inner insulating layer 141 or 142 formed on the frame 12A and on first portions of the lead pins 12B, and an outer insulating layer 161 or 162 formed on the inner insulating layer. The other part (second portions) of the lead pins 12B protrudes from the side end of the pair of electrically insulating layer members. As shown in FIG. 5, the first portions (portions sandwiched between the insulating layers 141, 142 and the insulating layers 161, 162) of the lead pins 12B are arranged substantially mutually in parallel, and substantially coplanar with the frame 12A.

The frame 12A and each of the lead pins 12B are made of a metal plate of, for example, Fe-Ni (including Ni of, for example, 42% or 50%) alloy or copper Cu, but they may be made of materials of different metal from each other.

The inner and outer insulating layers 141, 142, 161, 162 are made of, for example, an epoxy-based resin or polyimide-based resin. The inner insulating layers 141, 142 are bonded to the surface of each of the frame 12A and lead pins 12B with adhesives 131, 132 of, for example, an epoxy-based resin or a polyimide-based resin. The inner conductor patterns 151, 152 are formed on the surfaces of the inner insulating layers 141, 142. The outer insulating layers 161, 162 are bonded to the main surfaces of the inner insulating layers 141, 142 with the adhesives 131, 132 of the epoxy-based resin or polyimide-based resin like the inner insulating layers 141, 142 are bonded. On the surfaces of the outer insulating layers 161, 162 are formed outer conductor patterns 171, 172 and inner terminals 181, 182 (see FIG. 7). The inner terminals 181 (182) on the outer insulating layer 161 (162), though not shown in detail, are electrically connected to the inner terminals 182 (181) of the other outer insulating layer 162 (161) through the inner conductor pattern 151 (152), external conductor pattern 171 (172) and through hole plated layer 20A, 20B. In other words, the same signal or the same power supply voltage is supplied to the inner terminals 181, 182 which are formed on the opposite mounting surfaces of the module board 10 and electrically connected. The inner terminals 181, 182 are electrically connected to the lead pins 12B through the inner conductor patterns 151, 152, outer conductor patterns 171, 172 and through hole plated layers 20A, 20B.

The through hole plated layers 20A formed in the frame 12A are formed by plating the inner wall of the through holes 19A which are formed in the inner and outer insulating layers 141, 142, 161, 162, with, for example, copper Cu (though only one through hole is shown for simplicity sake). These through hole plated layers 20A are electrically insulated from the frame 12A by, for example, the epoxy-based resin or polyimide-based resin adhesive 133. Thus, through holes 120A larger than the through holes 19A are formed in the frame 12A.

The through hole plated layer 20B formed in each of the lead pins 12B is formed by plating the inner wall of the through holes 19B which are formed in the inner and outer insulating layers 141, 142, 161, 162 and lead pins 12B, with, for example, copper Cu. These through hole plated layers 20B are electrically connected with the lead pins 12B. In other words, the lead pins 12B are electrically connected to the inner conductor patterns 151, 152 and outer conductor patterns 171, 172 of the inner and outer insulating layers 141, 142, 161, 162 via the through hole layers 20B, and securely fixed to the board 10. Since these through hole plated layers 20A, 20B are made of copper (Cu) having a higher melting point than the solder mentioned above, they are not melted by heat generated by operating semiconductor devices 11.

Figure 4:
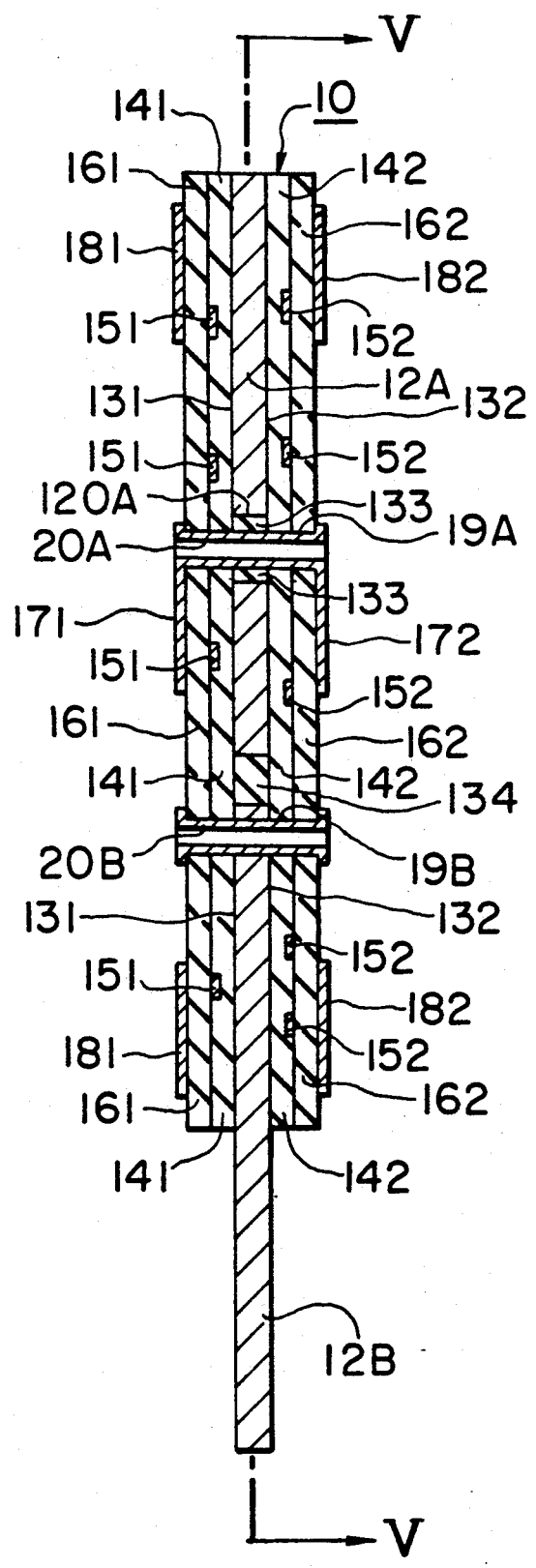
FIG. 4 is a cross-sectional view of a module board for an electronic device according to one embodiment of this invention, taken along line IV—IV in FIG. 7.
Figure 5:
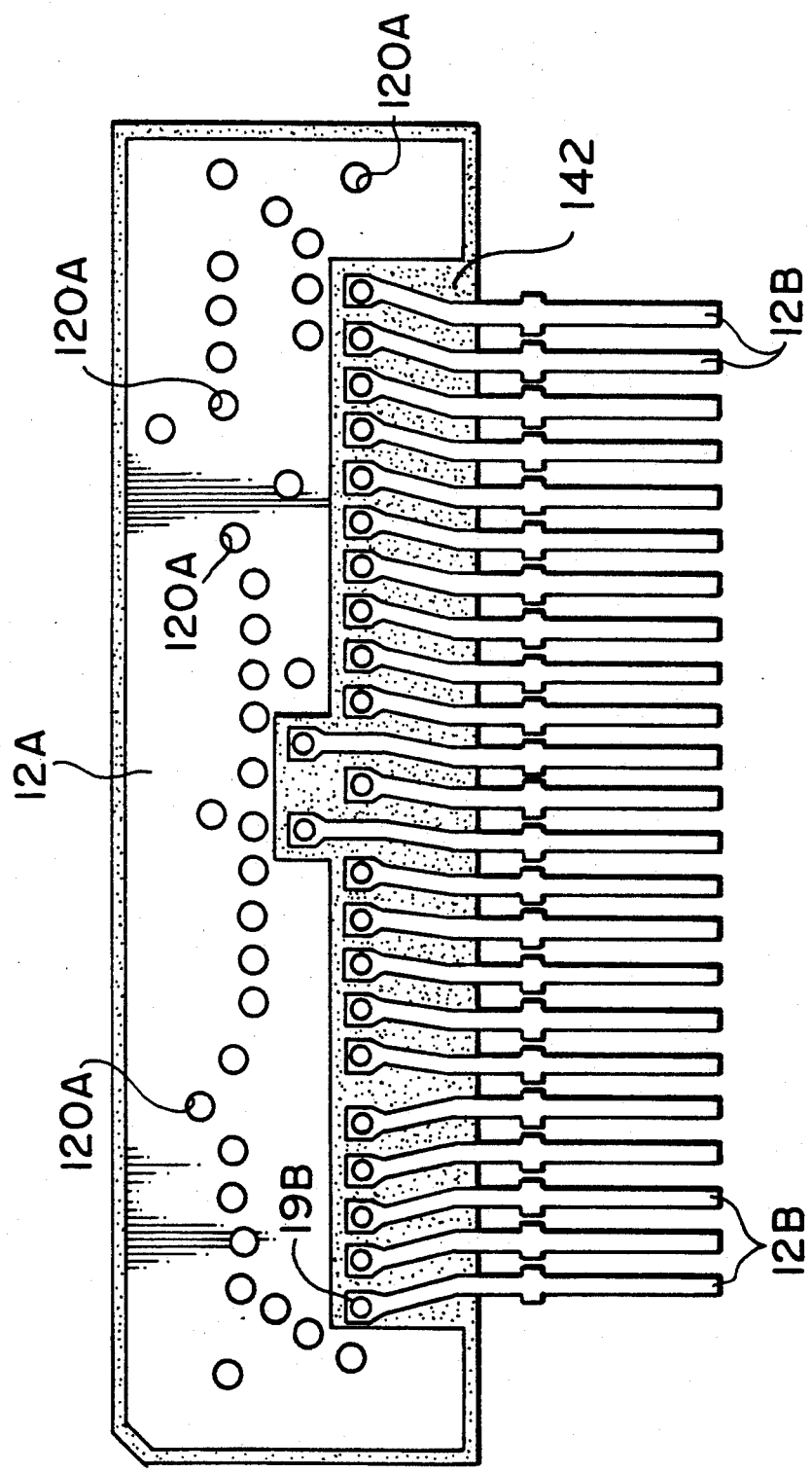
FIG. 5 is a plan view of the module board taken along line V—V in FIG. 4.

The frame 12A, as shown in FIGS. 4 and 5, is generally C-shaped such that the frame includes a combination of a rectangular portion extending lengthwise of the board 10 and leg portions extending from both ends thereof in a direction transverse to the lengthwise direction. The frame 12A is effective for reinforcing the mechanical strength of the module board 10. This frame 12A has the through holes 120A formed therein as described above. In the through holes 120A are formed through hole plated layers 20A to communicate with the through holes 19A which are formed in the insulating layers 141, 142, 161, 162. The through holes 120A each have a larger diameter than the through holes 19A in order for the through hole plated layer 20A and the frame 12A to be electrically insulated from each other by an insulating material 133 as described above.

The lead pins 12B are separated from the frame 12A and electrically insulated therefrom through an insulating adhesive 134. Moreover, the lead pins 12B are separated from the adjacent ones and electrically insulated through an adhesive identical with the adhesive 134.

While in the above embodiment the insulating layer members on both sides of the frame 12A have a conductor pattern, only one of both members may have a conductor pattern.

Figure 6:
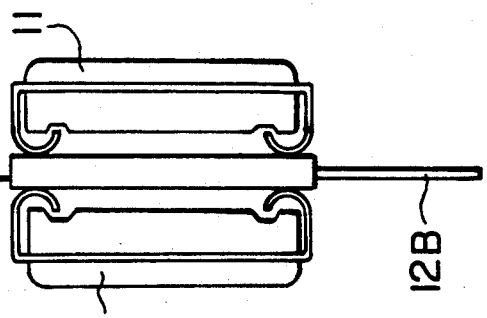
FIG. 6 is a side view of an electronic device according to one embodiment of the invention.
Figure 7:
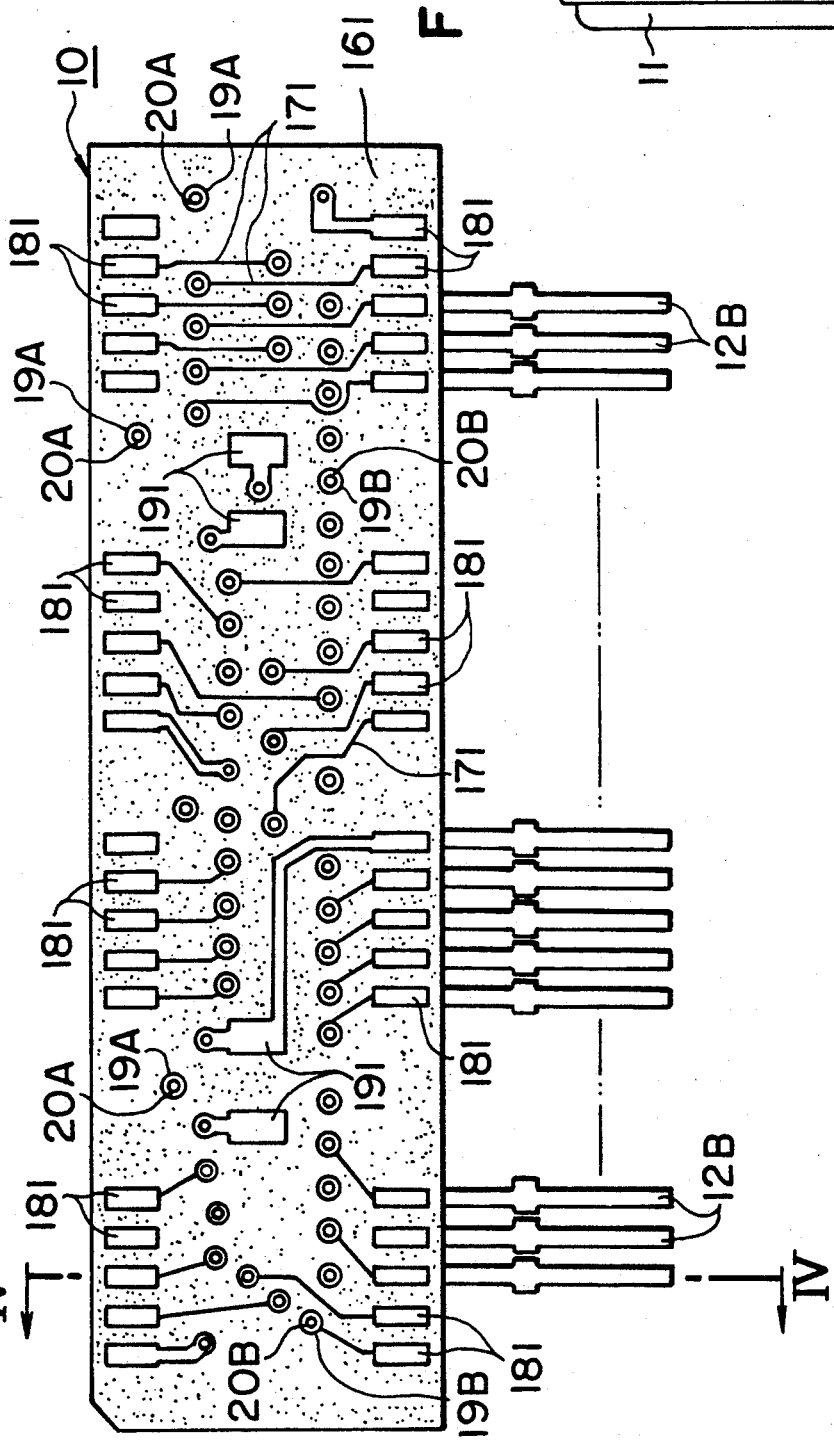
FIG. 7 is a plan view of the module board shown in FIG. 4.

FIG. 6 is a side view of an electronic device or an electronic module according to one embodiment of the invention, and FIG. 7 shows the module board for the device.

Figure 1B:
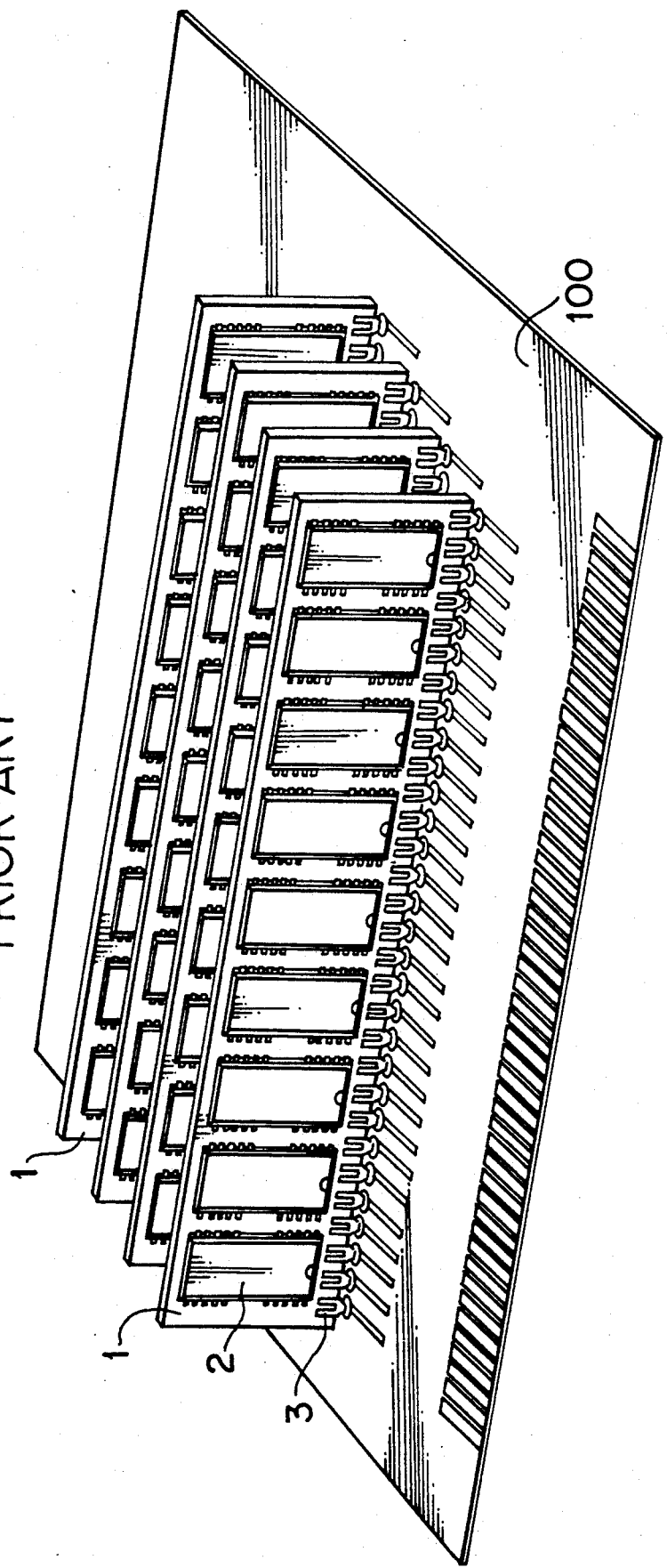
FIG. 1B is a perspective view of a memory board on which a large number of module boards are mounted.
Figure 2:
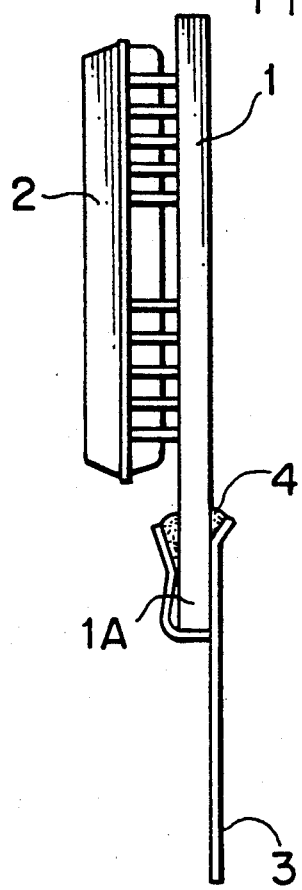
FIG. 2 is a side view of the device shown in FIG. 1A.
Figure 3:
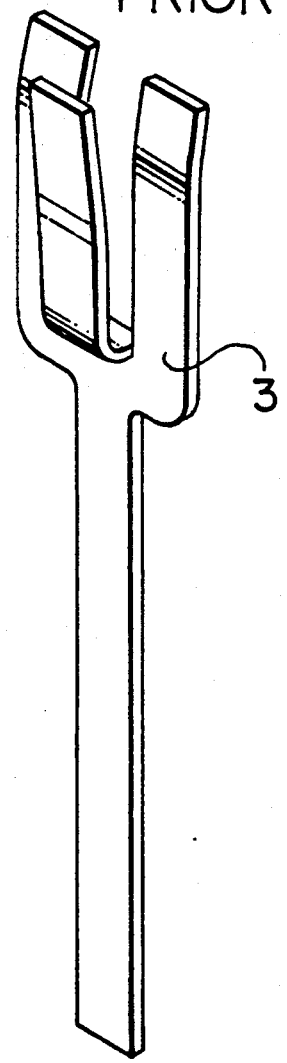
FIG. 3 is a perspective view of the lead pin used in the device shown in FIG. 2.

As shown in FIG. 6, in this module, a plurality of semiconductor memory devices 11 are mounted on the opposite mounting surfaces (on the left- and right-hand sides in the drawing) of the module plate which surfaces have patterns of conductors. This module board 10 has a plurality of lead pins 12B of which the first portions are buried in one-side end (the lower end in the drawing) of the module board. The memory devices 11 are securely bonded to the module board with, for example, solder. This electronic device or module is vertically mounted on a mounting surface of a mother board formed of a printed module board such as a memory board or a CPU board, such as shown in FIG. 1B.

The semiconductor memory devices 11 are formed of, for example, DRAMs. Each of the semiconductor memory devices 11 has a semiconductor chip with a DRAM function packaged by, for example, plastic molding. The plastic mold package is of a surface mount type, or SOJ (Small Outline J-lead) type, and may be a Gull Wing Lead Package such as TSOP (Thin Small Outline Package).

The outer insulating layer 141 of the module board 10 has, for example, a structure shown in FIG. 7, and the other outer insulating layer 142 may have a similar structure. The layer 141 is substantially of a rectangular shape, and may form a printed circuit board having a pattern of conductors formed on the surface of or within, for example, an insulating epoxy-based resin layer.

On the opposite mounting surfaces (the front surface and rear surface in the drawing) of the module board 10 are provided a plurality of inner terminals 181, 182 along the longitudinal direction of the board 10 in a regular order. These inner terminals 181, 182 are electrically connected to the lead pins 12B through the outer conductor patterns 171, 172, inner conductor patterns (not shown) and through hole plated layers 20A, 20B. Also, capacitor mounting lands 191 are formed on the opposite mounting surfaces. On each of the opposite mounting surfaces or on the front and rear surfaces of the module board 10, there are mounted two semiconductor memory devices 11, or on both surfaces are mounted four devices in total, though not limited to this number. Under the semiconductor memory devices 11 are mounted capacitors. The semiconductor memory devices 11 are mounted on the module board 10 in such a manner that the outer leads are arranged in the longitudinal direction of the module board 10, and the outer leads are electrically connected to the inner terminals 181, 182. In other words, in this embodiment, the semiconductor memory devices 11 are mounted on the mounting surface of the module board 10 in order to produce a multi-bit output, or arranged in the form of modules for bytes.

Thus, in the above embodiment, a plurality of semiconductor memory devices 11 are mounted on the mounting surfaces of the module board 10 and first ends of the lead pins 12B electrically connected to the semiconductor memory devices 11 are buried in one side end of the module board 10. This structure assures a mechanical strength of the module board, and removes the necessity of the clamping margin 1A which is held between the tongues of each lead pin that is electrically connected to the wiring conductors of the module board 10. Therefore, the size of the module board 10 can be decreased by the amount corresponding to the area of the clamping margin 1A, thus increasing the packing density of the electronic device or module.

Further, in the mother board (memory board, CPU board or the like) on which the modules or the electronic devices are mounted, the vertical height of the modules mounted on the mother board is reduced by an amount corresponding to the increase of the packing density of the modules, and thus the packing density in this height direction can be increased.

Moreover, within one end of the board 10 having a plurality of semiconductor memory devices 11 mounted on its mounting surfaces, there are provided lead pins 12B which are electrically connected to the semiconductor memory devices 11 through the conductor patterns 151, 152, 171, 172 which are formed in the module board 10. Also, through holes 19B are provided passing through the insulating layers 141, 142, 161, 162 having the conductor patterns 151, 152, 171, 172 and the lead pins 12B. In the inner walls of the through holes 19B are provided through hole plated layers 20B which are electrically connected to the conductor patterns and the lead pins 12B. Thus, the conductor patterns 151, 152, 171, 172 and lead pins 12B provided on the module board 10 are electrically connected via the through hole plated layers 20B and the lead pins 12B are securely fixed to the board 10. Since the connections therebetween are not melted with the heat generated from the operating semiconductor memory devices 11, the mechanical strength between the module board 10 and the lead pins 12B can be assured, and poor bonding therebetween can be prevented, thus increasing the electrical reliability of the module or electronic device.

The manufacturing process for the module board 10 will be described with reference to FIGS. 8A to 8E.

Figure 8A:
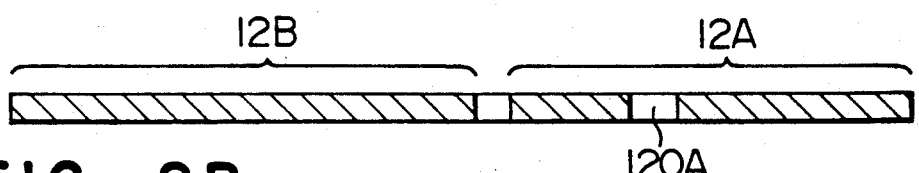
FIGS. 8A to 8E are diagrams for illustrating a manufacturing process of module boards.

As shown in FIG. 8A, a sheet of metal plate made of, for example, Fe-Ni alloy or copper (Cu) is subjected to etching to provide a lead frame having a frame 12A with through holes 120A formed therein and lead pins 12B.

Figure 8B:
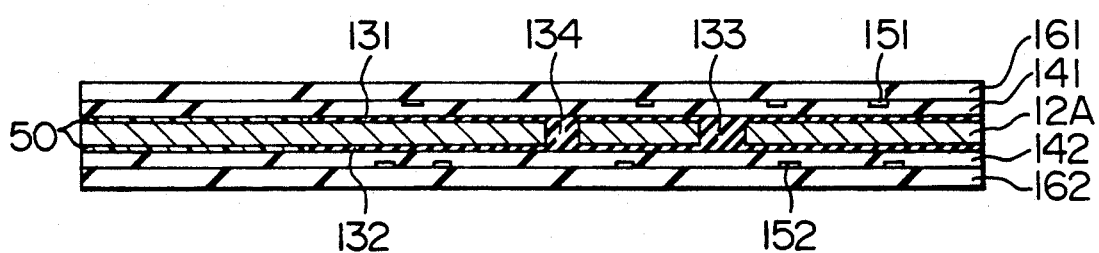

Then, as shown in FIG. 8B, those portions of the lead pins 12B which are exposed later (the second portions of the lead pins) are masked by separation layers 50, and an insulating adhesive for bonding the electrically insulating layer members to the leads is applied onto both surfaces of the lead frame as indicated by 131 and 132 and is provided to fill the spaces between the lead pins 12B and the frame 12A as indicated by 134 and to fill the through holes 120A as indicated by 133. Thereafter, inner insulating layers 141, 142 having inner conductor patterns 151, 152 (which are formed in the same way as the outer conductor patterns as described later) are formed and then outer insulating layers 161, 162 are formed through an adhesive (not shown) to form multiple layers on the lead frame, and these layers are pressed.

Figure 8C:
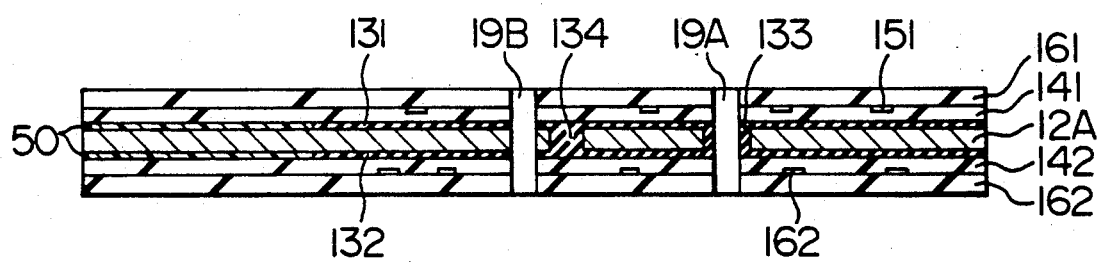
Figure 8D:
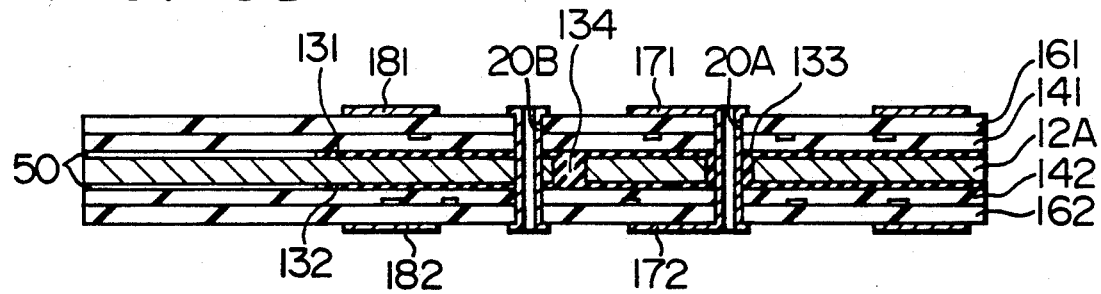

Next, as shown in FIG. 8C, through holes 19A, 19B are simultaneously formed at predetermined positions on the first portions of the lead pins 12B and at central portions of the through holes 120A by, for example, punching. In addition, as shown in FIG. 8D, the inner walls of the through holes 19A, 19B and the surfaces of the outer insulating layers 161, 162 are plated with, for example, copper and then the copper layers plated on the outer insulating layers are subjected to a patterning operation. In other words, a photosensitive positive photoresist film is applied to both of the plated copper layers, exposed through a mask pattern and developed, and unnecessary portions of the plated copper layers underlying the photoresist film are etched away through the photoresist mask. After the etching is completed, the photoresist is removed, completing the formation of the outer conductor patterns 171, 172, inner terminals 181, 182 and capacitor mounting lands 191.

Then, in order that the surfaces except the inner terminals 181, 182 and capacitor mounting lands 191 are covered by a solder-resist film, an epoxy-base negative photosensitive solder-resist is coated over the entire surfaces. The resist is not coated on the through hole conductors 20A, 20B. Under this condition, of the upper and lower surfaces the unnecessary portions of the photoresist under which the inner terminals 181, 182 and capacitor mounting lands 191 lie are removed by the known photolithography and etching processes.

Moreover, in order to prevent the exposed copper layers from being oxidized, the whole board is dipped in a solder bath so that the exposed copper layers are covered with solder, or that solder is coated thereon. In this case, the solder coating can be replaced by nickel/-gold plating.

Figure 8E:
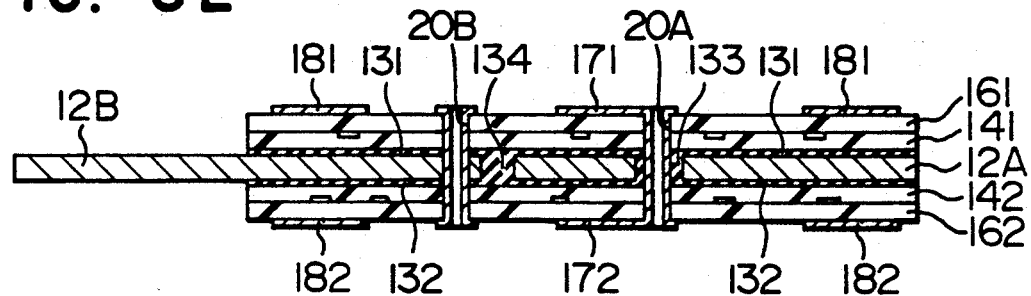

Then, as shown in FIG. 8E, those portions of the inner insulating layers 141, 142 and outer insulating layers 161, 162 which overlie the separation layer 50 are removed by punching or drilling means and then the separation layer 50 is removed. In this way, the insulating layers 141, 142, 161, 162 are removed to expose the lead pins 12B. After the lead pins 12B are exposed, the surfaces of the lead pins, if necessary, are coated with solder or surface-treated, rinsed and treated for lead punching, thus completing the module board 10.

Figure 9:
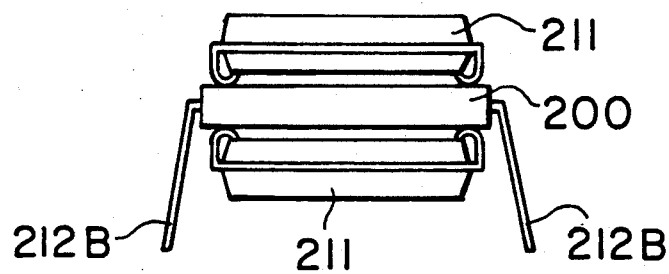
FIG. 9 is a side view of the electronic device according to another embodiment of the invention.

FIG. 9 shows an electronic device or module of a dual-in-line type having a module board according to another embodiment of this invention.

As shown in FIG. 9, the dual-in-line type module or electronic device has a plurality of semiconductor memory devices 211 mounted on opposite mounting surfaces of a dual-in-line module board 200. First ends of lead pins 212B similar to the lead pins 12B are buried in the left and right end portions (as viewed in the drawing) of the module board 200. This dual-in-line type electronic device is effective for increasing the packing density like the electronic devices in the above-described embodiments and can accommodate a great number of lead pins 212B.

Figure 10A:
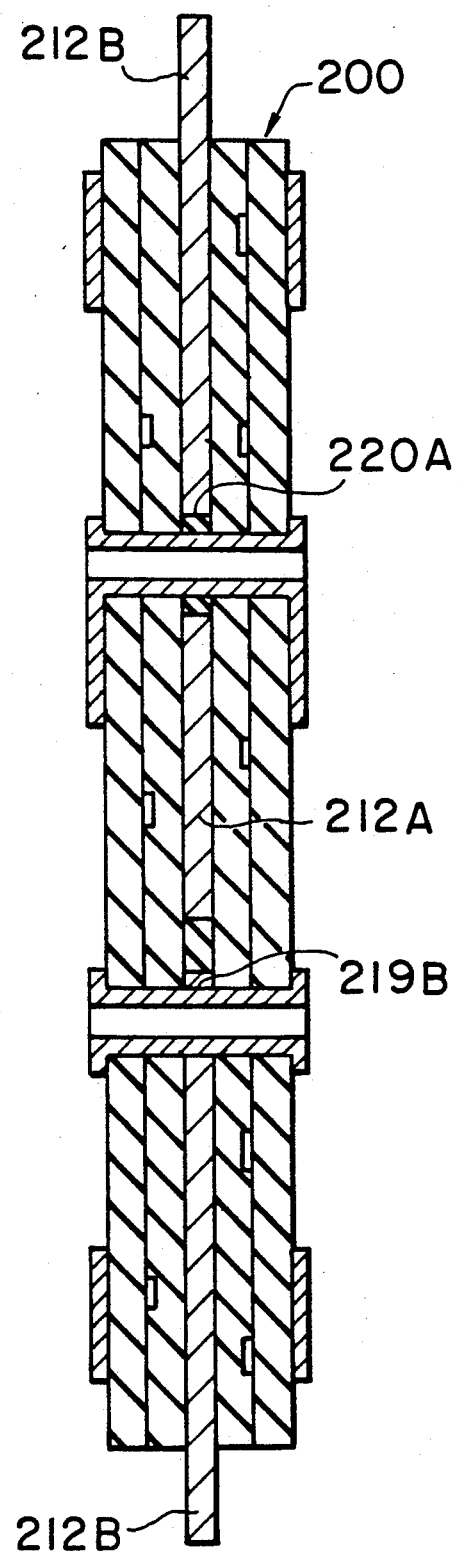
FIGS. 10A and 10B are a cross-sectional view and a plan view of a module board which may be used in the device shown in FIG. 9.
Figure 10B:
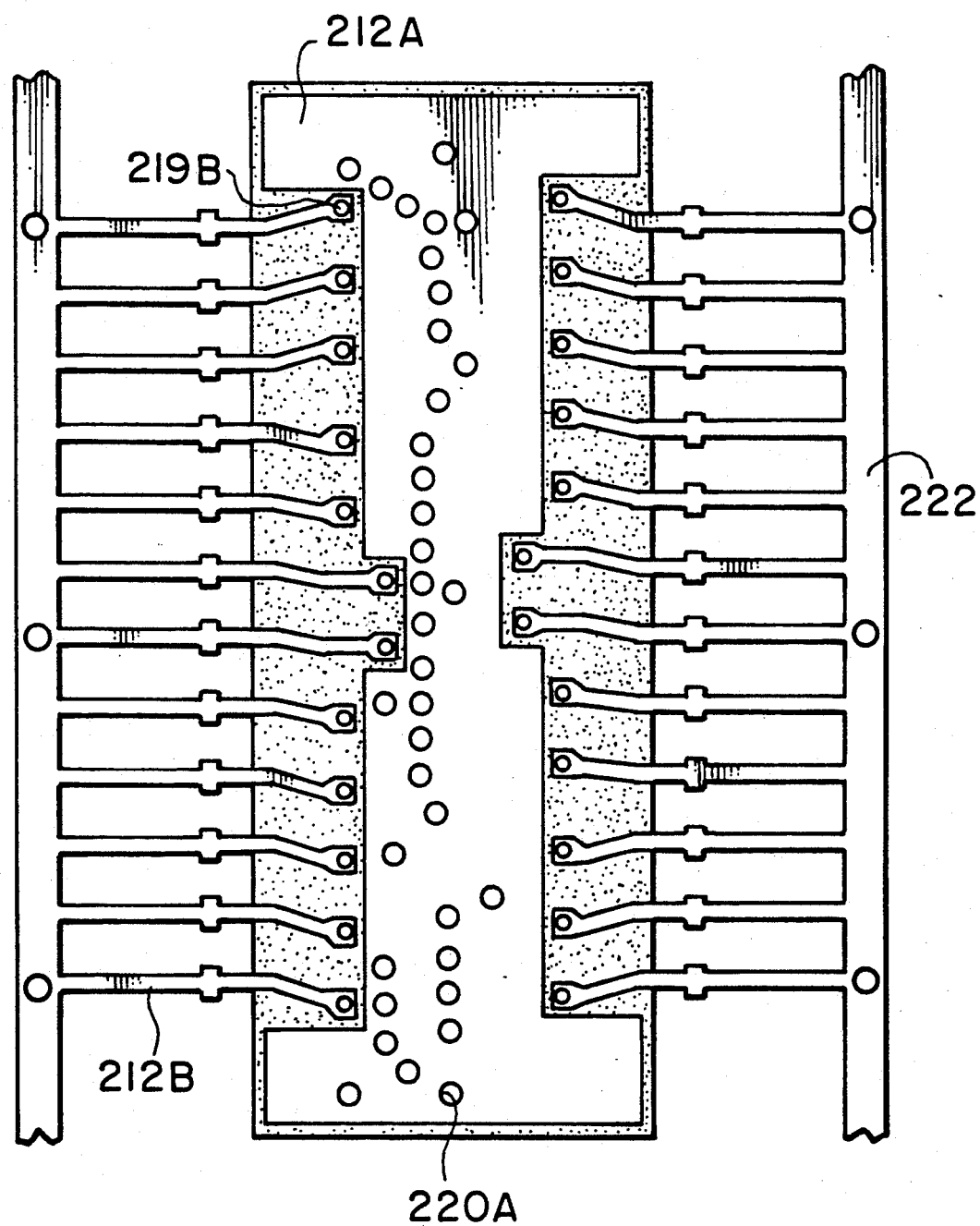

FIGS. 10A and 10B are similar to FIGS. 4 and 5 and show a module board 200 which can be used for the module shown in FIG. 9. As illustrated, the frame 212A is substantially H-shaped. Reference numeral 212B represents lead pins, 222 a frame for supporting the lead pins 212B, 219B through holes which are formed in the first portions of the lead pins at predetermined positions, and 220A through holes formed in the frame 212A.

Figure 11:
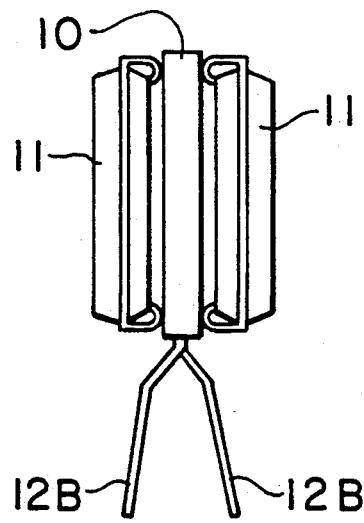
FIGS. 11 and 12 are side views of an electronic device according to a further embodiment of the invention.

FIG. 11 shows a zigzag-line type module or electronic device according to still another embodiment of the invention.

As shown in FIG. 11, in the zigzag-line type module, the second portions of the lead pins 12B of the module in the embodiment shown in FIG. 6 are alternately bent to be separated in the opposite directions from the plane in which the first portions lie. This zigzag-line type module has the same effect of the above-given embodiment, and can have the lead pins arranged at a fine pitch.

Figure 12:
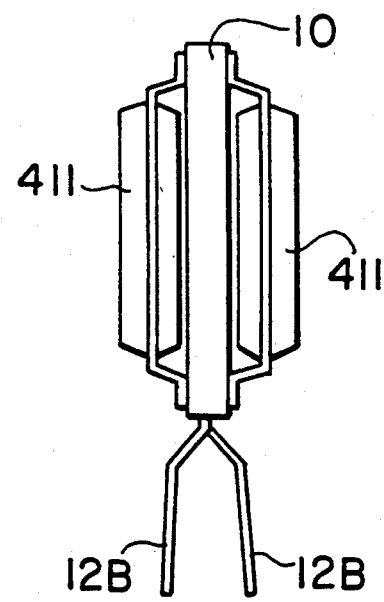

FIG. 12 shows a module or electronic device which is similar to that shown in FIG. 11 but semiconductor devices 411 mounted on the module board 10 are of the TSOP package in which the leads are bent in a gull wing shape.

Figure 13:
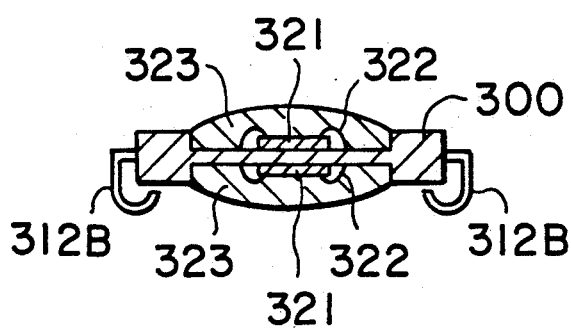
FIGS. 13 and 14 are schematical cross-sectional views of an electronic device according to a still further embodiment of the invention.

FIG. 13 is a cross-sectional view of a COB (Chip On Board) type module or electronic device according to a further embodiment of this invention.

As shown in FIG. 13, in the COB type module, a plurality of bare semiconductor chips (not packaged) 321 are mounted on the mounting surfaces of a module board 300, external terminals (bonding pads) formed on semiconductor chips 321 and conductor pattern of a module board 300 or lead pins 312B of which one ends are buried in the board 300 are electrically connected together by bonding wires 322, and the entire board is packaged by molding using a polyimide-based resin encapsulation material. This COB type module has the similar effect to the above embodiments, and takes a more simplified structure than in the above embodiments in the molding structure for the semiconductor chips 321 and thus this module can be small-sized.

Figure 14:
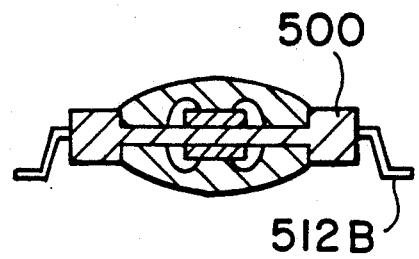

FIG. 14 shows a module or an electronic device which is similar to that shown in FIG. 13 but lead pins 512B protruding from a module board 500 are bent in a gull wing shape.

While some embodiments of the invention are given above, this invention is not limited to the above embodiments, but can of course take other various different modifications without departing from the scope of this invention.

For example, this invention can be applied to a module or an electronic device using a ceramic substrate for a module board on which semiconductor devices are mounted.

Moreover, this invention is not limited to a module using the so-called module board, but can be applied to a module using a mounting board such as a memory board and a CPU board.

We claim:

1. A module board comprising;

a support plate;

a plurality of slender lead pins each having a first portion arranged substantially in parallel with one another on a plane substantially coplanar with said supporting plate and a second portion extending from said first portion;

a pair of electrically insulating layer members sandwiching said supporting plate and said first portion, said supporting plate, said first portion being isolated from one another with an electrically insulating material between said pair of electrically insulating layer members, said second portion protruding from said pair of electrically insulating layer members, at least one of said electrically insulating layer members being provided with a pattern of electrical conductors; and a first through hole formed through said first portion of each of said lead pins and a first through hole conductor formed on a wall of each through hole, each through hole conductor passing through said pair of electrically insulating layer members and said first portion and being in electrical connection with said pattern of electrical conductors.

2. A module board according to claim 1, further comprising at least one second through hole formed through said support plate and a second through hole conductor formed on an inner wall of each of said at least one second through hole, said second through hole conductor passing through said pair of electrically insulating layer members and said supporting plate and being insulated from said supporting plate and in electrical connection with said pattern of electrical conductors.

3. A module board according to claim 1, in which each of said electrically insulating layer members includes an inner insulating layer formed contiguous with said supporting plate and said first portion, and an outer insulating layer formed contiguous with said inner insulating layer, said inner and outer insulting layers being provided with inner and outer conductor patterns electrically connected with each other to constitute said pattern of electrical conductors.

4. A module board according to claim 1, in which said supporting plate is substantially C-shaped such that said supporting plate has two opposite sections substantially parallel with said slender lead pins and a section substantially perpendicular thereto.

5. A module board according to claim 1, in which said second portion of said slender lead pins is alternately bent in two opposite directions away from a plane in which said first portion of said lead pins lie.

6. An electronic device having a module board according to claim 5 and having a plurality of packaged semiconductor devices mounted on at least one of said electrically insulating layer members of said module board.

7. An electronic device according to claim 6, in which said packaged semiconductor devices have small outline J-lead (SOJ) packages.

8. An electronic device according to claim 6, in which said packaged semiconductor devices have thin small outline (TSO) packages.

9. An electronic device having a module board according to claim 5 and having a plurality of bare semiconductor chips mounted on at least one of said electrically insulating layer members of said module board.

10. An electronic device having a module board according to claim 1 and having a plurality of packaged semiconductor devices mounted on at least one of said electrically insulating layer members of said module board.

11. A module board according to claim 1, wherein said supporting plate is an electrically conductive plate.

12. An electronic device having a module board according to claim 1 and having a plurality of bare semiconductor chips mounted on at least one of said electrically insulating layer members of said module board.

* * * * *